United States Patent
Chen

(10) Patent No.: US 6,946,689 B2
(45) Date of Patent: Sep. 20, 2005

(54) CONTROL TFT FOR OLED DISPLAY

(75) Inventor: Kun-Hong Chen, Danshuei Township (TW)

(73) Assignee: Au Optronics Corp., Hsinchu (TW)

( * ) Notice: Subject to any disclaimer, the term of this patent is extended or adjusted under 35 U.S.C. 154(b) by 64 days.

(21) Appl. No.: 10/743,927

(22) Filed: Dec. 23, 2003

(65) Prior Publication Data

US 2005/0062053 A1 Mar. 24, 2005

(30) Foreign Application Priority Data

Sep. 18, 2003 (TW) ...................................... 92125704 A

(51) Int. Cl.[7] .............................................. H01L 51/00
(52) U.S. Cl. ........................ 257/101; 257/225; 257/227
(58) Field of Search ................................ 257/101, 225, 257/227

(56) References Cited

U.S. PATENT DOCUMENTS

| | | | | |
|---|---|---|---|---|
| 6,351,078 B1 | * | 2/2002 | Wang et al. ............ | 315/169.3 |
| 6,384,427 B1 | * | 5/2002 | Yamazaki et al. ............ | 257/59 |
| 6,417,521 B2 | * | 7/2002 | Inukai ............ | 257/59 |
| 6,501,227 B1 | * | 12/2002 | Koyama ............ | 315/169.3 |
| 6,509,616 B2 | * | 1/2003 | Yamazaki ............ | 257/390 |
| 2003/0089910 A1 | * | 5/2003 | Inukai ............ | 257/66 |

* cited by examiner

*Primary Examiner*—Allan R. Wilson
(74) *Attorney, Agent, or Firm*—Thomas, Kayden, Horstemeyer & Risley

(57) ABSTRACT

The present invention discloses a control TFT structure (i.e. a driving TFT) for reducing leakage in an OLED display. A semiconductor layer, such as a polysilicon layer, is deposited on a transparent substrate as a channel region. A lightly doped region and a drain region are disposed on one side of the polysilicon layer and a source region is disposed on the opposite side of the polysilicon layer. An insulating layer is deposited covering the surface of the polysilicon layer, the lightly doped region, and the source/drain regions. Source and drain electrodes are disposed in the insulating layer, electrically connecting the source and drain region respectively. A gate metal layer is disposed on the insulating layer, at approximately the top right portion of the polysilicon layer to form a transistor structure.

12 Claims, 9 Drawing Sheets

US 6,946,689 B2

CONTROL TFT FOR OLED DISPLAY

BACKGROUND OF THE INVENTION

1. Field of the Invention

The present invention relates to a driving circuit of a thin-film transistor electroluminescent (TFT-EL) display, and more particularly to a control TFT in a pixel for driving a light-emitting diode (LED) in a TFT-EL display, which reduces current leakage therein.

2. Description of the Related Art

Currently, flat panel Liquid crystal displays (LCDs) are widely implemented in various electronic devices, such as notebooks and televisions.

The predominant type of LCD currently employed is the thin film transistor LCD (TFT LCD), which is operated by active addressing, meaning each pixel is individually addressed by a corresponding thin film transistor. Due to the maturity of TFT fabrication processes, large size LCD devices are also widely available.

Conventional TFT LCDs, however, are limited by poor transmittance. This is particularly true with regard to color flat panel displays. Hence, a backlight module is typically coupled to the TFT LCD to provide adequate light transmittance. A major drawback of backlight modules, however, is excessive power consumption, which limits the application of TFT LCDs in portable electronic devices. Another drawback of backlight modules is size, limiting which LCDs from attaining a thinner profile. For example, when a typical fluorescent tube lamp is utilized in a backlight module coupled to an LCD panel, the thickness of the resulting LCD monitor increases by ¾ to 1 inch accompanied by an increase in weight.

Electroluminescent (TFT-EL) displays have been forwarded as the ideal solution as they offer low power consumption and eliminate the need for backlight modules. Typically, the individual pixels of a TFT-EL display can be self-addressed to emit light and therefore do not require additional backlight to provide excellent transmittance.

The developing electroluminescent (TFT-EL) displays are known as organic electroluminescence device or organic light emitting diode (OLED). Referring to FIG. 1, a circuit for driving an organic light-emitting diode (OLED) in a TFT-EL display is shown. In the circuit, the OLED ($O_{10}$) is controlled by two thin-film transistors ($T_{10}$ and $T_{20}$) and one capacitor ($C_{10}$). When the scan line ($S_{10}$) is driven, the switch TFT $T_{10}$ is switched on and the signal from the data line ($D_{10}$) is input to the capacitor $C_{10}$. When the capacitor $C_{10}$ is charged, a current source V supplies a current to drive the organic light-emitting diode ($O_{10}$) according to the I-V characteristic of the control TFT ($T_{20}$) and the voltage level of the capacitor ($C_{10}$). The control TFT ($T_{20}$) is also called a "driving TFT".

The capacitor ($C_{10}$) is charged when the switch TFT ($T_{10}$) is switched on and the switch TFT ($T_{10}$) is switched off when charging is complete. The gate voltage of the control TFT ($T_{20}$) is controlled by the capacitor ($C_{10}$) and therefore the current is determined accordingly. The luminance and gray scale of the OLED ($O_{10}$) is determined by the current from the control TFT ($T_{20}$). After the switch TFT ($T_{10}$) is switched off, any leakage of the control TFT ($T_{20}$) will affect the capacitance of the capacitor ($C_{10}$) and decrease the current, thereby affecting the luminance and gray scale of the OLED ($O_{10}$).

SUMMARY OF THE INVENTION

One object of the present invention is to reduce current leakage in the driving circuit after the switch TFT is switched off, by providing an OLED device containing control TFT structures of the invention to reduce current leakage in the driving circuit.

Another object of the present invention is to provide a method for fabricating the control TFT structure.

To achieve these objects, the present invention provides a control TFT structure, also known as driving TFT. In a preferred embodiment, a control thin film transistor for controlling an organic light-emitting diode (OLED) comprises a semiconductor layer disposed on the substrate as a channel region. A first and a second doped region are sequentially disposed on one side of the semiconductor layer, wherein the doped concentration of the first doped region is lower than that of the second doped region, and the first doped region serves as a single-side lightly doped drain region and the second doped region serves as a drain region. A third doped region disposed on the opposite side of the semiconductor layer, serving as a source region. An insulating layer is disposed on the surface of the semiconductor layer, the first, second, and third regions. Source and drain electrodes are disposed penetrating the insulating layer to contact the source and drain regions respectively. A conductive layer serving as a gate layer is disposed in the insulating layer, at approximately the top right portion of the semiconductor layer. The drain electrode of the control TFT receives a drain voltage and the source electrode is electrically connected to an OLED unit to control the current.

In another embodiment, a control TFT as disclosed above further comprises a lightly doped source region between the semiconductor layer and the source region, which is smaller than the lightly doped drain region.

The present invention further provides a method of fabricating the control TFTs. A first photoresist layer is utilized to form source and drain regions on the semiconductor layer by photolithography. A second photoresist layer is then utilized to form a lightly doped drain region or lightly doped drain and source regions adjacent to the drain and source regions, wherein the lightly doped drain region is larger than the lightly doped source region.

An electroluminescent display device is further provided according to the invention, which sequentially scans a plurality of pixels to form a display screen and provides current to the scanned pixels according to pixel signals received during scanning, thereby activating electroluminescent units in the pixels to display FIGS. according to pixel signals. The device is characterized by having control TFTs as disclosed above in the pixels to control the current provided to the scanned pixels.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

First Embodiment

FIGS. 2A to 2F show a fabrication process of a control TFT having a single-side lightly doped drain region (LDD) according to one embodiment of the invention.

Figure 1:
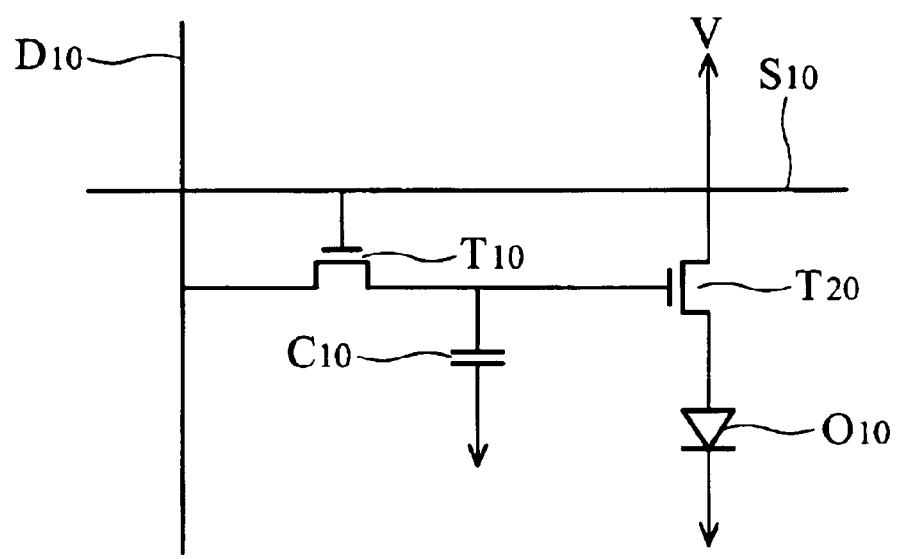
FIG. 1 is a driving layout of a conventional pixel in an OLED TFT-EL display pixel.
Figure 2A:
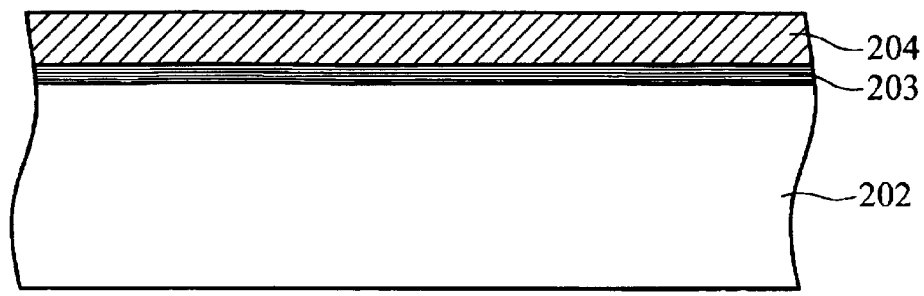
FIGS. 2A to 2F show a fabrication process of a control TFT having a single-side lightly doped drain region according to one embodiment of the invention.

As FIG. 2A shows, an insulating layer 203 is optionally deposited on a transparent glass substrate 202. In a preferred embodiment, silicon oxide or silicon nitride (SiNx) is deposited by plasma enhanced chemical vapor deposition (PECVD) on the glass substrate 202 to prevent sodium ion out-diffusion to the subsequently formed transistors. An amorphous silicon (a-Si) layer 204 is then formed on the insulating layer 203 by LPCVD with a thickness of approximately 50 nm. The amorphous silicon (a-Si) layer is further defined by conventional photolithography to form a defined amorphous silicon layer. The defined amorphous silicon layer is further treated with an Excimer laser (XeCl), which generates parallel laser beams with linear energy distribution by an optical lens set. The amorphous silicon layer crystallizes at a temperature less than 600° C. to form a low temperature polysilicon (LTPS) layer 204 as a semiconductor layer. The above steps of defining the amorphous silicon layer and the crystallization are interchangeable.

Figure 2B:
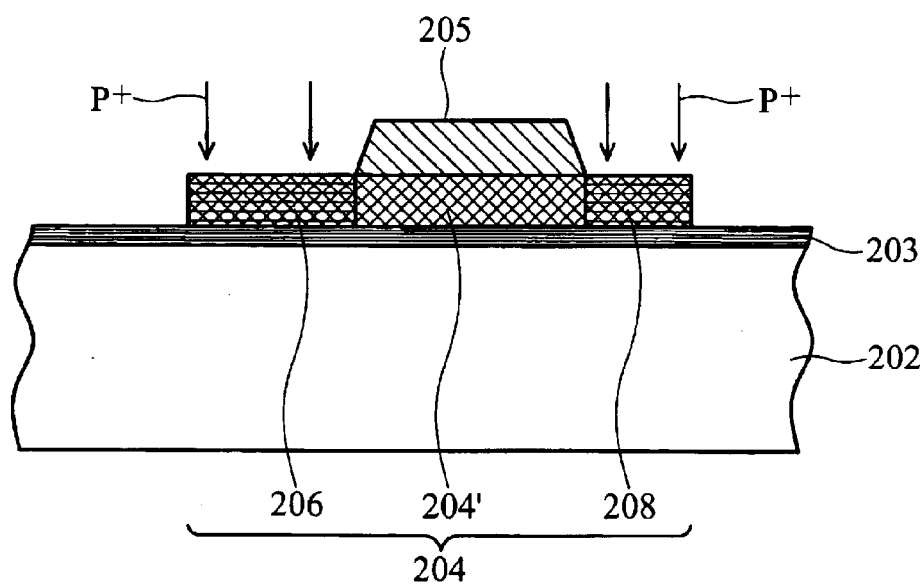

As shown in FIG. 2B, a photoresist layer 205 is formed and patterned by conventional photolithography on the polysilicon layer 204, exposing the reserved source and drain areas on the polysilicon layer 204. An ion implantation is then performed on the polysilicon layer 204 using the photoresist layer 205 as a mask. P-type dopants are implanted into the uncovered polysilicon layer 204 to form source and drain regions 206 and 208 on opposite sides of the polysilicon layer 204 respectively. After removing the photoresist layer 205, the un-implanted polysilicon between the source and drain regions 206 and 208 are exposed, serving as a channel region 204' as shown in FIG. 2B.

Figure 2C:
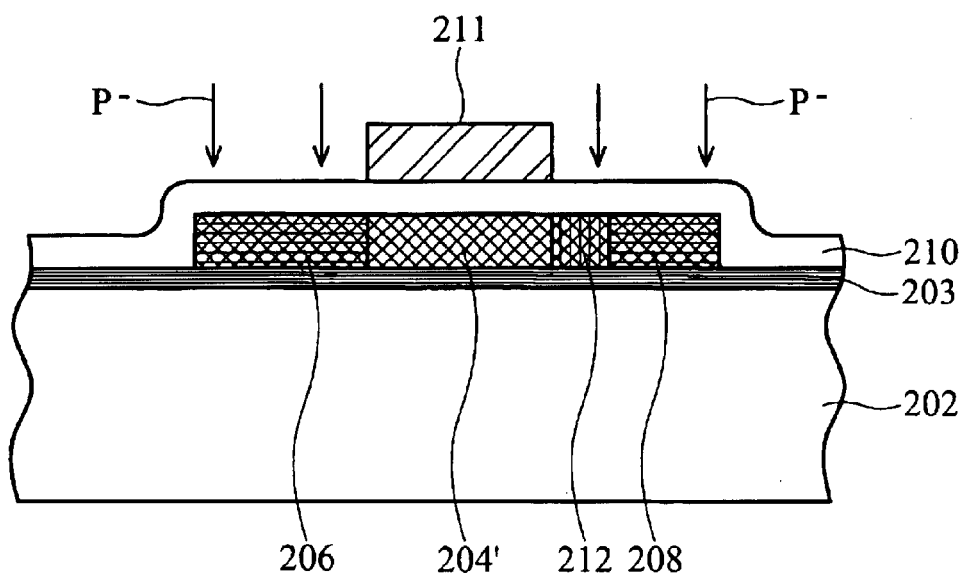

As shown in FIG. 2C, an insulating layer 210, such as a silicon oxide layer, is deposited covering the surface of the substrate 202, serving as a gate dielectric layer. A second photoresist layer 211 is then formed and patterned on the insulating layer 210 to cover most of the undoped polysilicon layer 204' and expose a portion of the undoped polysilicon layer 204' adjacent to the drain region 208, as shown in FIG. 2C. A second ion implantation is then performed to implant a low concentration of p-type ions into the uncovered polysilicon layer 204' adjacent to the drain region 208 to form a lightly doped drain (LDD) region 212 between the undoped polysilicon layer 204' and the drain region 208.

The substrate 202 is then preferably subjected to a rapid thermal process to drive the implanted dopants into the polysilicon layer 204.

Figure 2D:
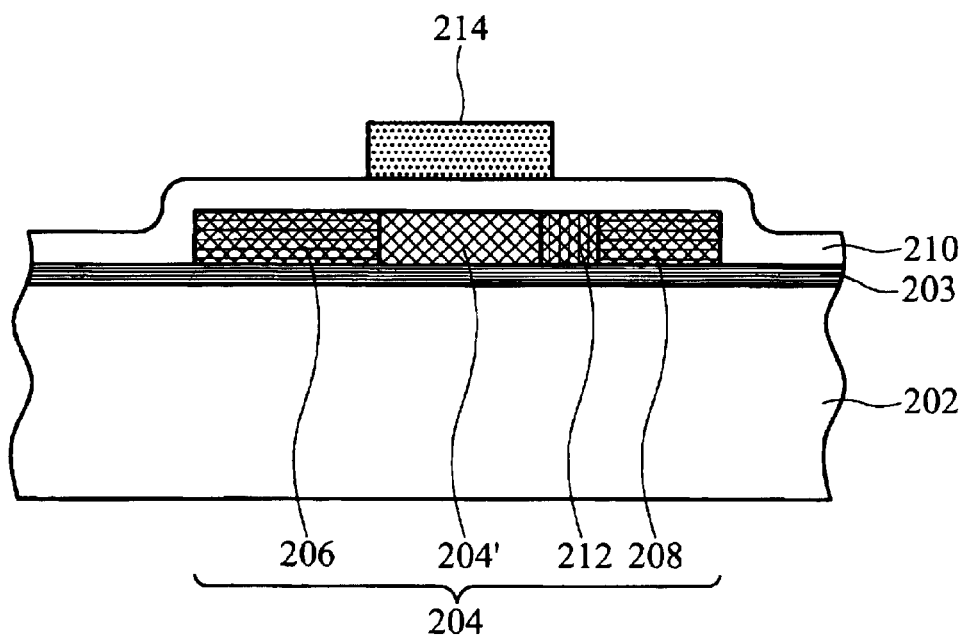

As shown in FIG. 2D, a conductive layer, such as chromium, aluminum, or an alloy of tungsten and molybdenum formed by deposition or sputtering, is formed on the insulating layer 210 and patterned as a gate electrode 214 at approximately the right top of the undoped polysilicon layer 204' by photolithography.

Figure 2E:
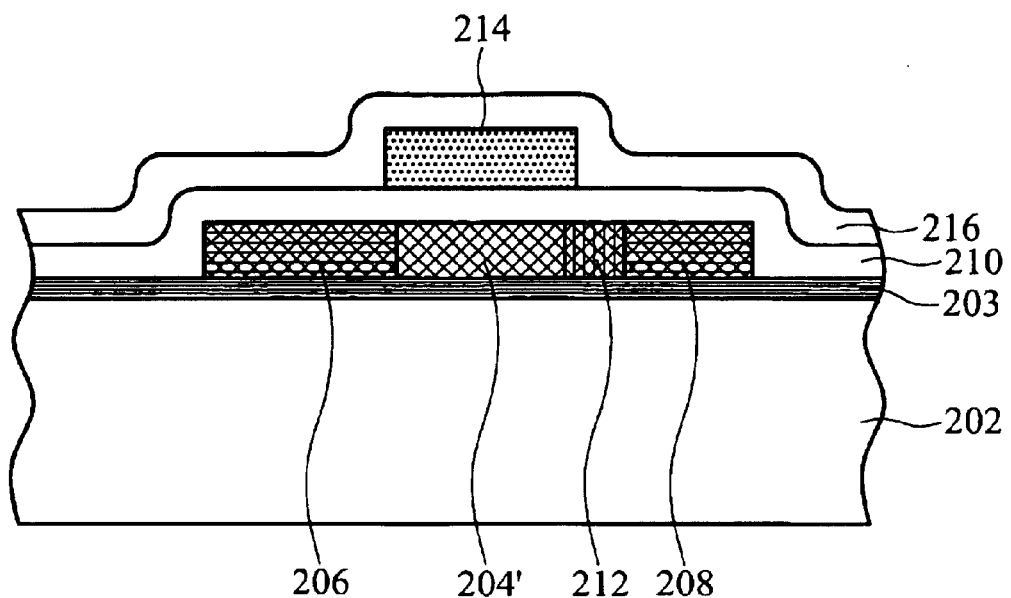

In FIG. 2E, another insulating layer 216 is deposited on the surface of the substrate 202, isolating the gate electrode 214 and the transistor structure.

Figure 2F:
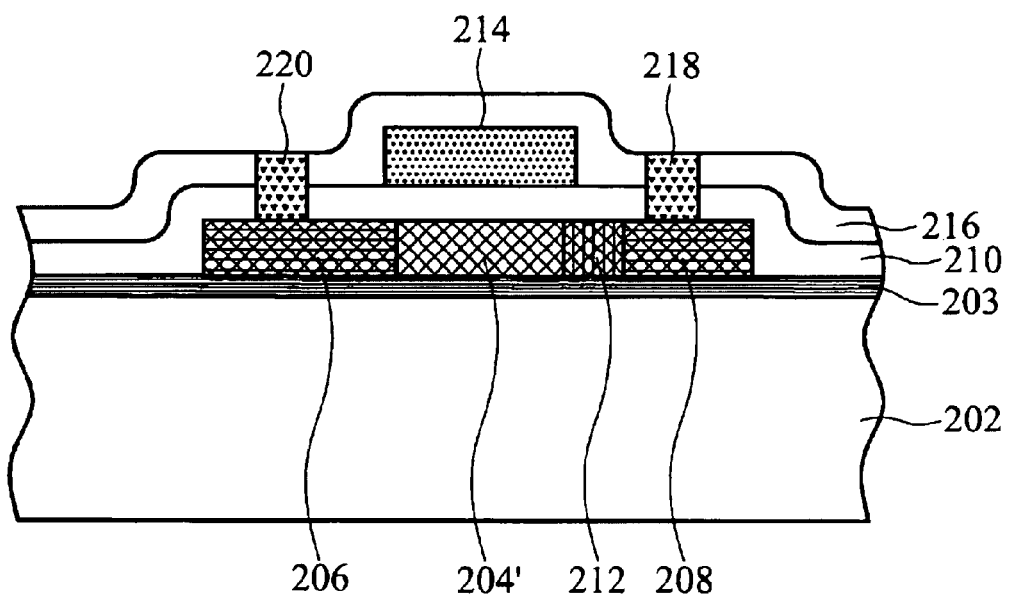

In FIG. 2F, the insulating layers 216 and 210 are etched to form two openings exposing the drain and source regions 206 and 208 respectively. The openings are then filled with conductive material to form drain and source electrodes 220 and 218 in contact with the drain and source regions 206 and 208 respectively. Thus, a PMOS control TFT, i.e. a p-type TFT, with a single-side LDD structure is formed.

An NMOS control TFT, i.e. an N-type TFT, can also be formed similarly with n-type dopant implantation.

Second Embodiment

FIGS. 3A to 3F show a fabrication process of a control TFT with a lightly doped source region smaller than the lightly doped drain region according to one embodiment of the invention.

As FIG. A shows, an insulating layer 303 is optionally deposited on a transparent glass substrate 302. In a preferred embodiment, silicon oxide or silicon nitride (SiNx) is deposited by plasma enhanced chemical vapor deposition (PECVD) on the glass substrate 302 to prevent sodium ion out-diffusion to the subsequently formed transistors. An amorphous silicon (a-Si) layer 304 is then formed on the insulating layer 303 by LPCVD with a thickness of approximately 50 nm. The amorphous silicon (a-Si) layer is further defined by conventional photolithography to form a defined amorphous silicon layer. The defined amorphous silicon layer is further treated with Excimer laser (XeCl), which generates parallel laser beams with linear energy distribution by an optical lens set. The amorphous silicon layer crystallizes at a temperature less than 600° C. to form a low temperature polysilicon (LTPS) layer 304 as a semiconductor layer. The above steps of defining the amorphous silicon layer and the crystallization are interchangeable.

Figure 3A:
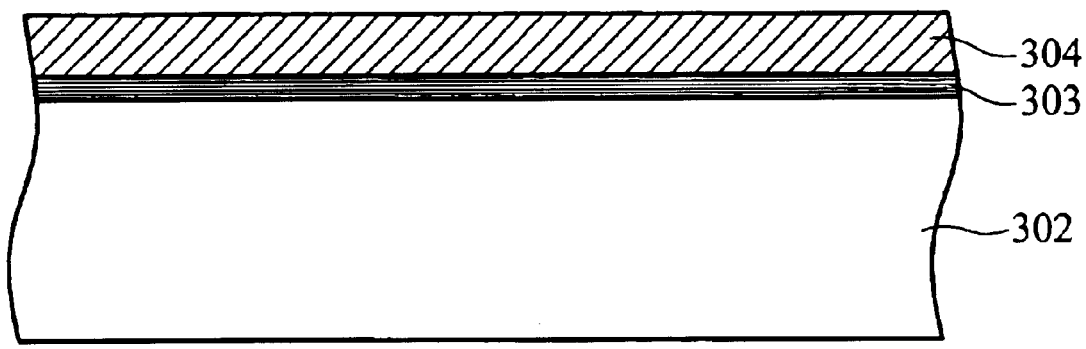
FIGS. 3A to 3F show a fabrication process of a control TFT having asymmetric lightly doped source/drain regions according to one embodiment of the invention.
Figure 3B:
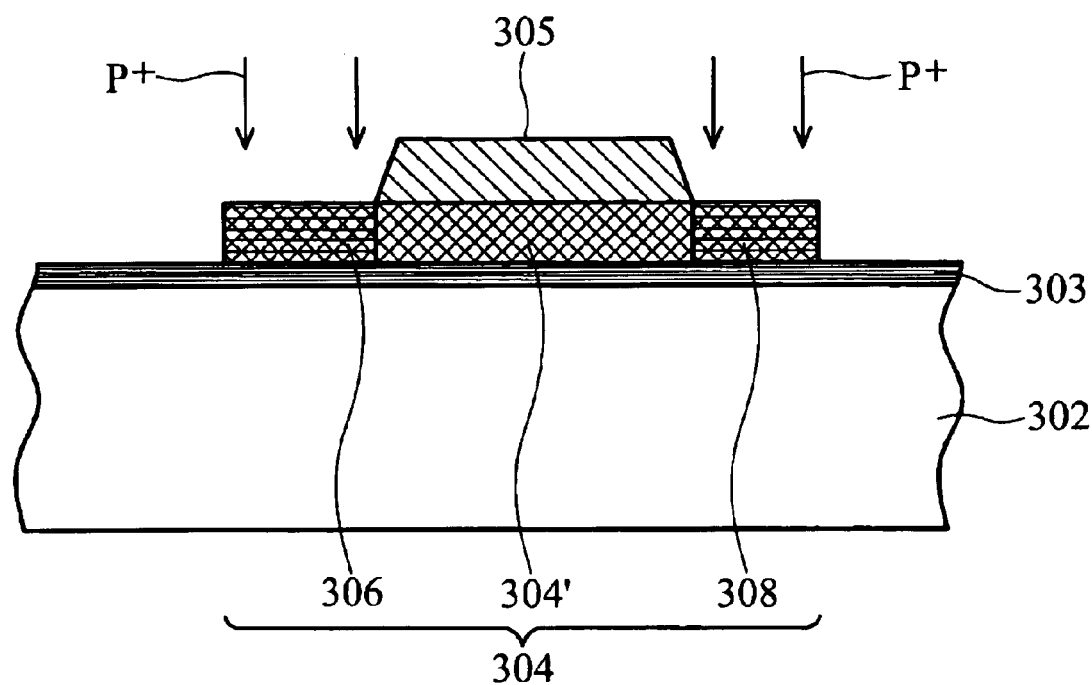

As shown in FIG. 3B, a photoresist layer 305 is formed and patterned by conventional photolithography on the polysilicon layer 304, exposing the reserved source and drain areas on the polysilicon layer 304. Ion implantation is then performed on the polysilicon layer 304 using the photoresist layer 305 as a mask. P-type dopants are implanted into the uncovered polysilicon layer 304 to form source and drain regions 306 and 308 on opposite sides of the polysilicon layer 304 respectively. After removing the photoresist layer 305, the un-implanted polysilicon layer between the source and drain regions 306 and 308 is exposed, and serves as a channel region 304' as shown in FIG. 3B.

Figure 3C:
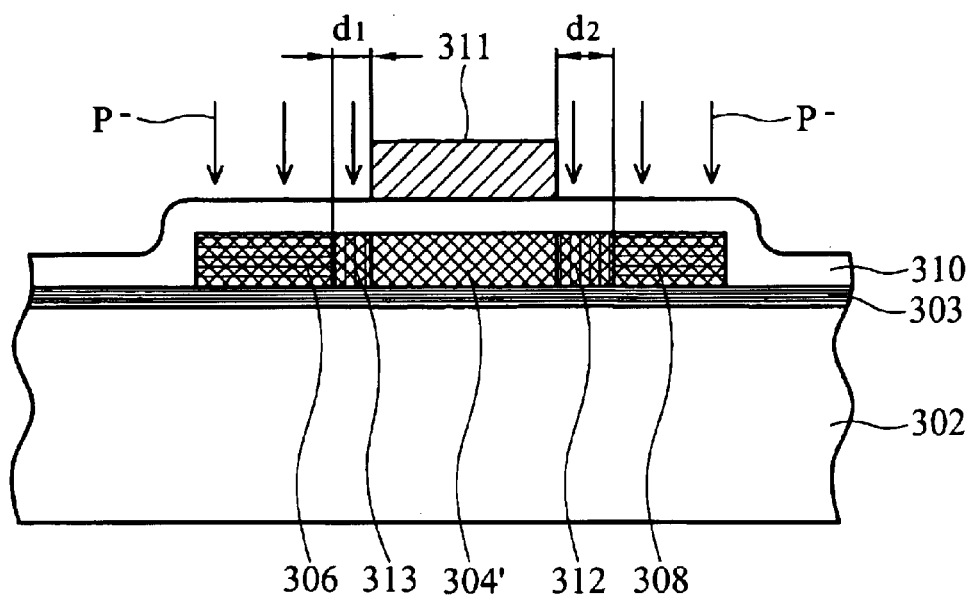

FIG. 3C shows an insulating layer 310, such as a silicon oxide layer, deposited covering the surface of the substrate 302, serving as a gate dielectric layer. A second photoresist layer 311 is then formed and patterned on the insulating layer 310 to cover most of the undoped polysilicon layer 304' but expose portions on opposite sides of the undoped polysilicon layer 304' adjacent to the drain region 308 with a length d2 and source region 304 with a length d1 respectively, as shown in FIG. 3C, wherein d2>d1. A second ion implantation is then performed using photoresist layer 311 as a mask to implant a low concentration of p-type ions into the uncovered polysilicon layer 304' adjacent to the drain region 308 and source region 306 respectively. A lightly doped drain (LDD) region 212 and a lightly doped source region 312 are formed on opposite sides of the undoped polysilicon layer 304'. The lightly doped source region 313 is smaller than the lightly doped drain region 312, thereby forming an asymmetric lightly doped structure.

The substrate 302 is then preferably subjected to a rapid thermal process to drive the implanted dopants into the polysilicon layer 304.

Figure 3D:
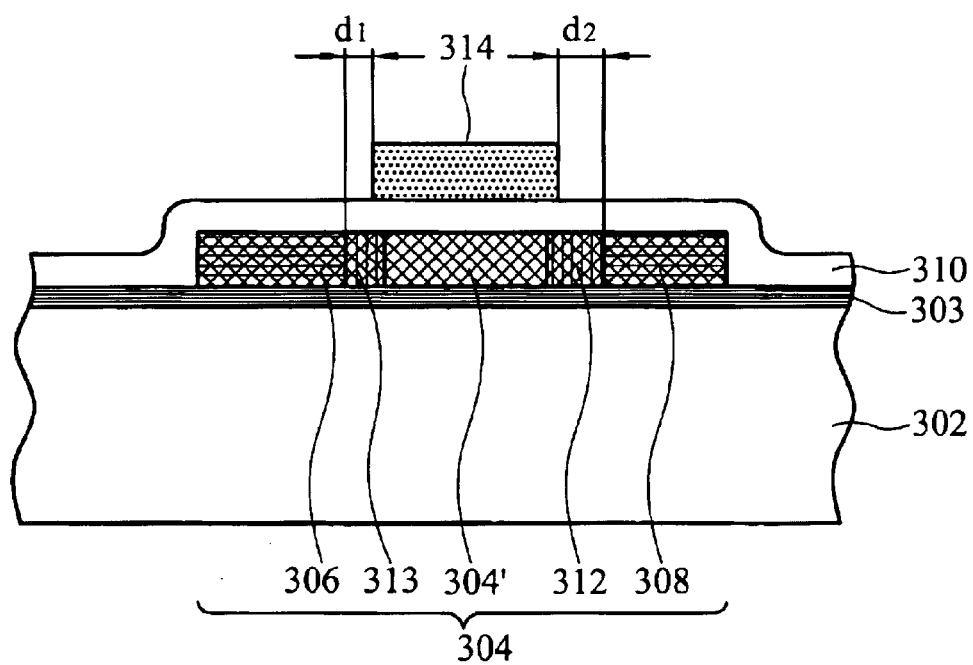

As shown in FIG. 3D, a conductive layer, such as chromium, aluminum, or an alloy of tungsten and molybdenum formed by deposition or sputtering, is formed on the insulating layer 310 and patterned as a gate electrode 314 at approximately the right top of the undoped polysilicon layer 304' by photolithography.

Figure 3E:
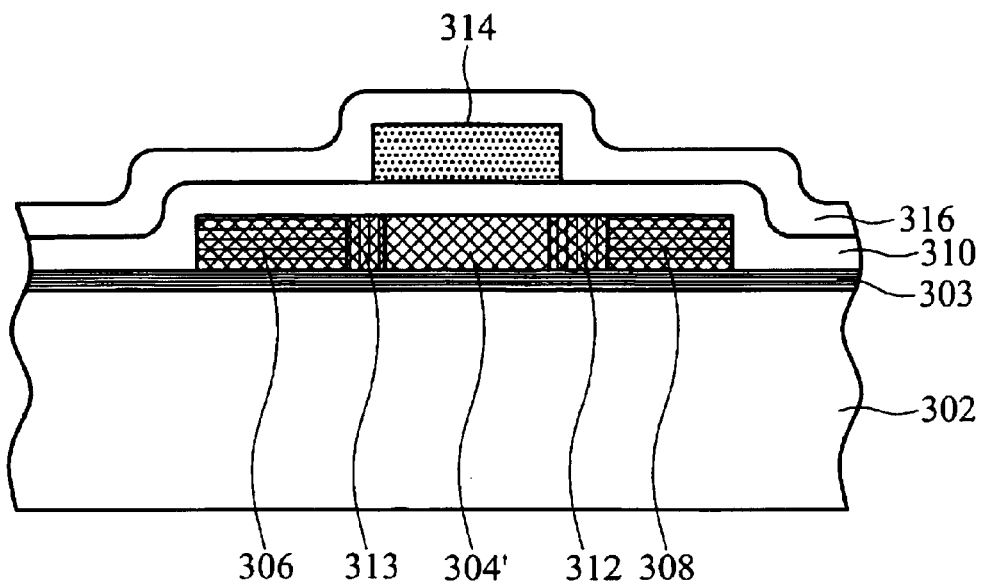

In FIG. 3E, another insulating layer 316 is deposited on the surface of the substrate 302, isolating the gate electrode 314 and the transistor structure.

Figure 3F:
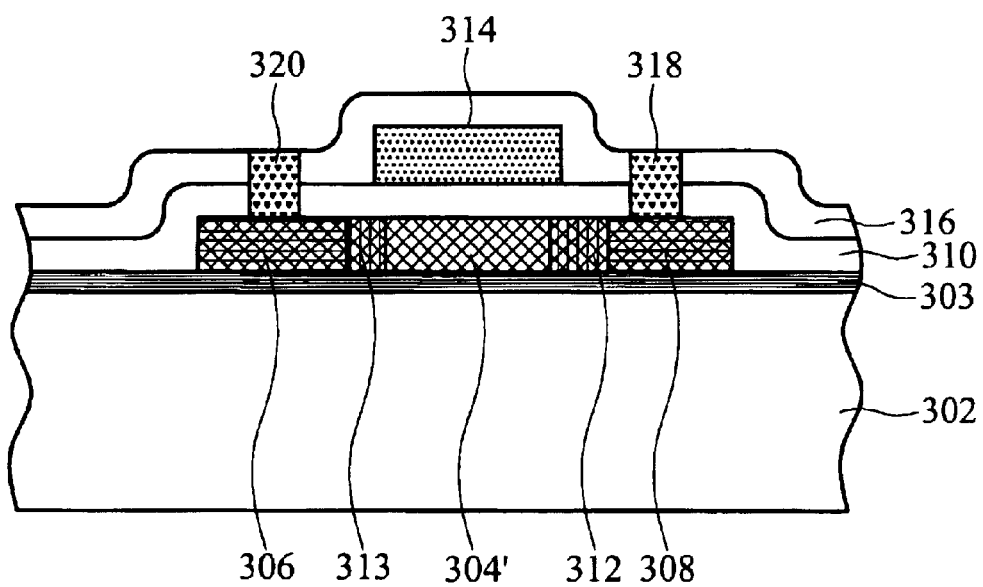

In FIG. 3F, the insulating layers 316 and 310 are etched to form two openings exposing the drain and source regions 306 and 308 respectively. The openings are then filled with conductive material to form drain and source electrodes 320 and 318 in contact with the drain and source regions 306 and 308 respectively. Thus, a PMOS control TFT, i.e. a P-type TFT, with asymmetric lightly doped regions is formed.

An NMOS control TFT, i.e. an N-type TFT, with asymmetric lightly doped regions can also be formed similarly by n-type dopant implantation.

The TFTs formed either by first or second embodiment can be introduced in an electroluminescent display device as control TFTs in pixels. In an OLED pixel, the drain electrode 218 or 318 of the control TFT receives a drain voltage and the source electrode 220 or 320 is electrically connected to an OLED unit.

Electric Property Testing

Hereinafter, some results from electric property testing of a conventional control TFT, i.e. without LDD, and a single-side LDD control TFT are shown and discussed.

Current Leakage

Figure 4A:
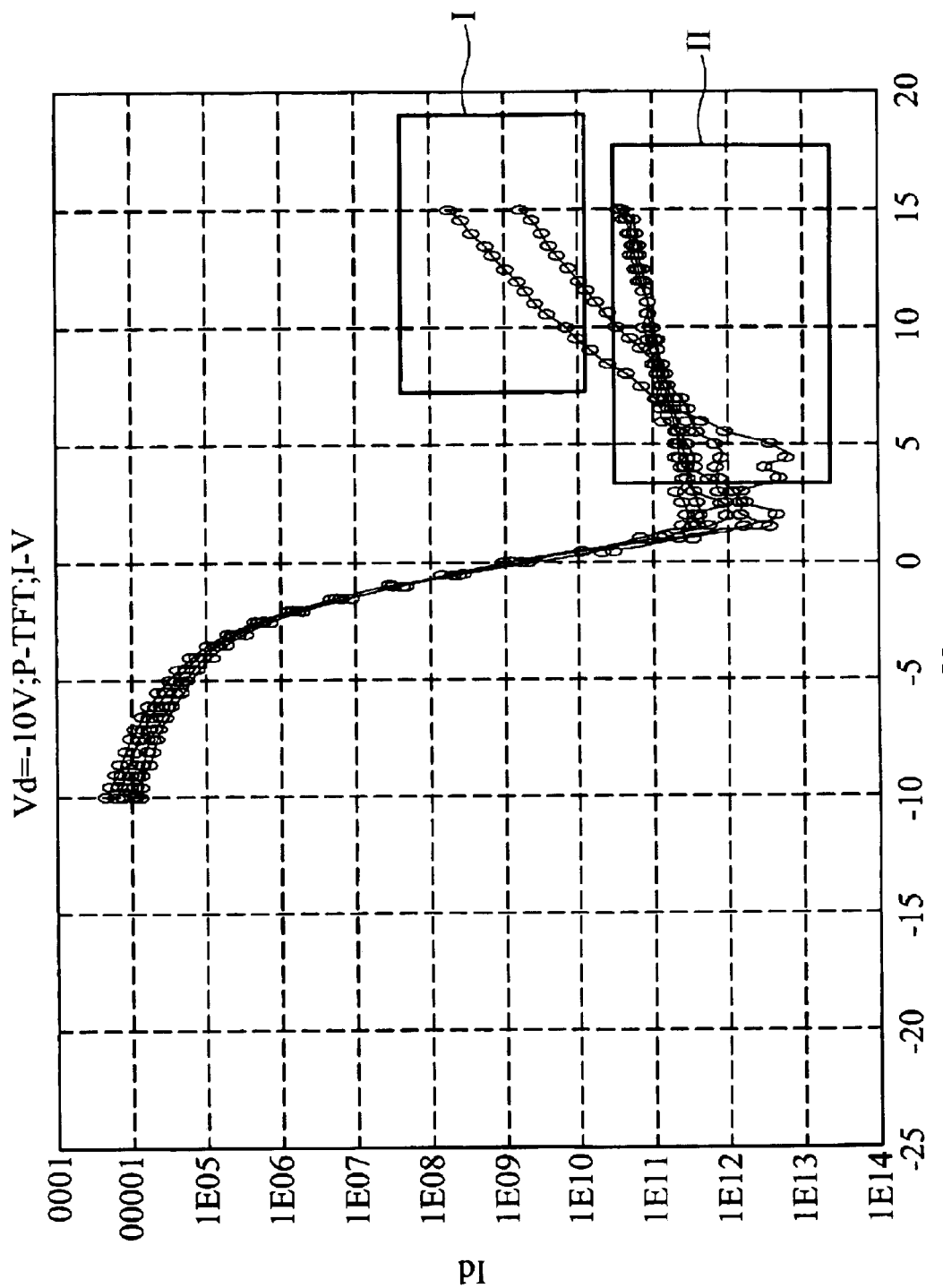
FIGS. 4A and 4B show current leakage of conventional doped and single-side lightly doped p/n-type TFTs of the invention.

FIG. 4A shows current leakage of a conventional p-type doped TFT, i.e. no extra lightly doped source or drain region, and a single-side lightly doped p-type TFT of the invention. Curve I is the I-V distribution of gate voltage (Vg) and the drain current (Id) when applying −10V drain voltage to a conventional p-type TFT without lightly doped regions. Curve II is the I-V distribution of gate voltage (Vg) and the drain current (Id) when applying −10V drain voltage to a single-side lightly doped p-type TFT of the invention. When the gate voltage is between 10V to 15V, the current of the single-side lightly doped p-type TFT of the invention (curve II) is lower than that of the conventional p-type TFT (Curve I). It is obvious that a p-type control TFT with a lightly doped drain region reduces current leakage under high voltage.

Figure 4B:
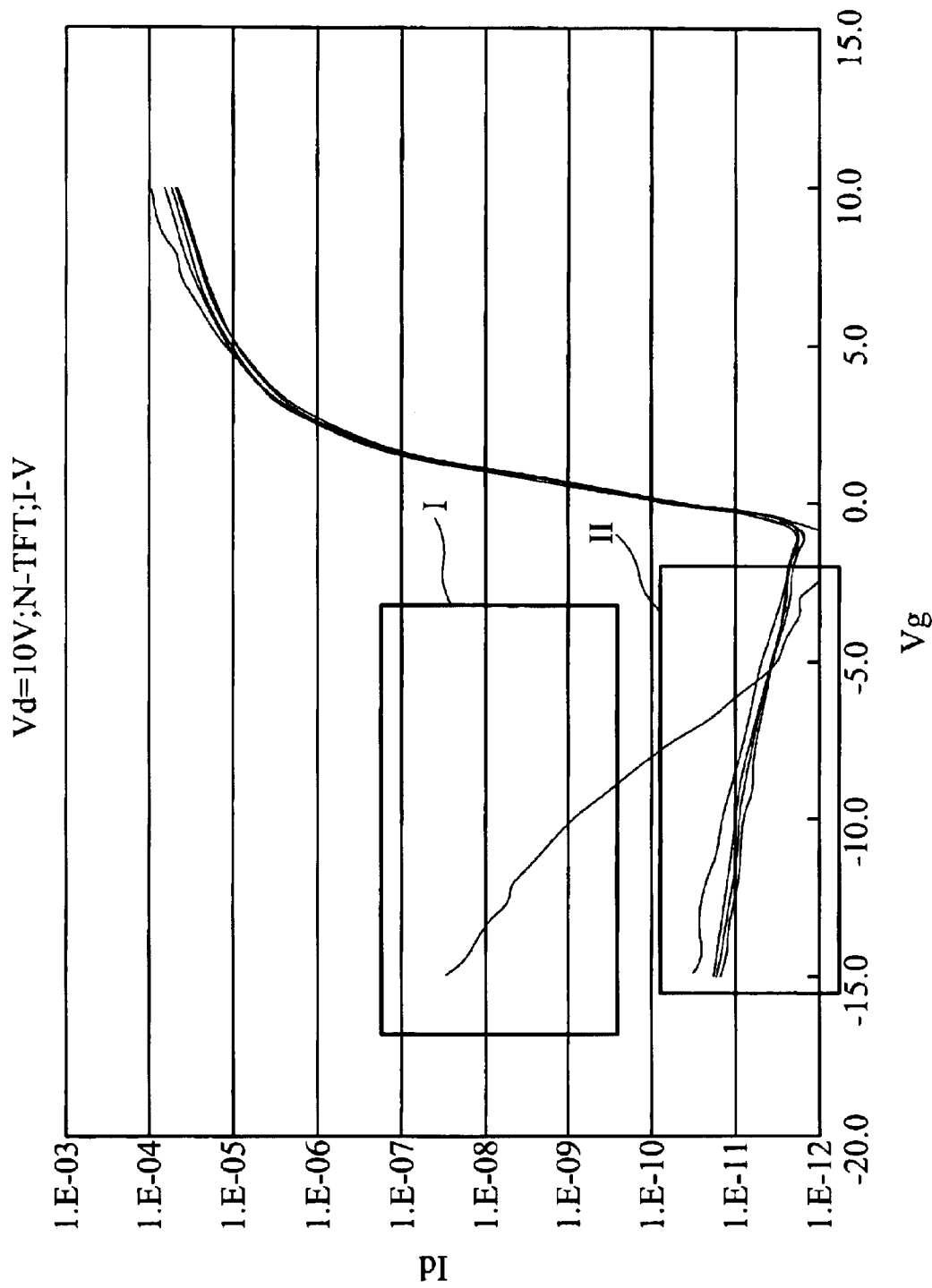

Similarly, FIG. 4B shows current leakage of a conventional doped n-type TFT, i.e. no extra lightly doped source or drain region, and a single-side lightly doped n-type TFT of the invention. Curve I is the I-V distribution of gate voltage (Vg) and the drain current (Id) when applying 10V drain voltage to a conventional n-type TFT without lightly doped regions. Curve II is the I-V distribution of gate voltage (Vg) and the drain current (Id) when applying 10V drain voltage to a single-side lightly doped n-type TFT of the invention. When the gate voltage is between −5V to −15V, the current of the single-side lightly doped n-type TFT of the invention (curve II) is lower than that of the conventional n-type TFT (Curve I). It is obvious that an n-type control TFT with a lightly doped drain region also effectively reduces current leakage under high voltage.

Mobility Testing

TABLE 1

|  | Single-side lightly doped region | Conventional structure | Symmetric lightly doped regions |
| --- | --- | --- | --- |
| Ufe | 166 | 165 | 123 |

The mobility of three types of control TFTs are compared and listed in Table 1. It is obvious that the mobility of the control TFT with a single-side lightly doped drain region of the invention is approximately equal to the conventional control TFT without lightly doped regions. However, the mobility of a control TFT with symmetric lightly doped regions, i.e. lightly doped drain and source regions of equal length on opposite sides of the gate electrode, is significantly lower than the conventional control TFT by about 25%. Conversely, the control TFT of the present invention still possesses the same mobility as the conventional control TFT. Thus, the control TFT of the invention can reduce current leakage without affecting mobility which represents conductive current.

In an electroluminescent display device, the drain region of a control TFT in an OLED pixel is connected to high voltage. The control TFTs with single-side lightly doped regions or asymmetric lightly doped regions are effective in reducing current leakage in OLED pixels.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A control thin film transistor for controlling an organic light-emitting diode (OLED), comprising:

a substrate;

a semiconductor layer disposed on the substrate as a channel region;

a first and second doped region sequentially disposed on first side of the semiconductor layer, wherein the doped concentration of the first doped region is lower than that of the second doped region, and the first doped region serves as a single-side lightly doped drain region and the second doped region serves as a drain region;

a third doped region disposed on a second side of the semiconductor layer, which is opposite to the first side, serving as a source region;

an insulating layer disposed on the surface of the semiconductor layer, and the first, second, and third regions;

a source and drain electrode penetrating the insulating layer contacting the source and drain regions respectively, wherein the drain electrode receives a drain voltage and the source electrode is electrically connected to an OLED unit; and a conductive layer serving as a gate layer disposed in the insulating layer, at approximately the top right portion of the semiconductor layer.

2. The control thin film transistor as claimed in claim 1, wherein the semiconductor layer is composed of polysilicon.

3. The control thin film transistor as claimed in claim 1, wherein the first, second and third doped regions are n-type doped.

4. The control thin film transistor as claimed in claim 1, wherein the first, second and third doped regions are p-type doped.

5. An electroluminescent display device, which sequentially scans a plurality of pixels composing a display screen and provides current to the scanned pixels according to pixel signals received while scanning, thereby activating electroluminescent units in the pixels to display figures on the display screen according to the pixel signals, the device is characterized by having a plurality of control TFTs as claimed in claim 1 in the pixels to control the current provided to the scanned pixels.

6. The control thin film transistor as claimed in claim 1, wherein the first, second and third doped regions are mainly composed of silicon.

7. An electroluminescent display device, which sequentially scans a plurality of pixels composing a display screen and provides current to the scanned pixels according to pixel signals received while scanning, thereby activating electroluminescent units in the pixels to display figures on the display screen according to the pixel signals, the device is characterized by having plurality of control TFTs as claimed in claim 6 in the pixels to control the current provided to the scanned pixels.

8. A control thin film transistor for controlling an organic light-emitting diode (OLED), comprising:

a substrate;

a semiconductor layer disposed on the substrate as a channel region;

a first and second doped region sequentially disposed on a first side of the semiconductor layer, wherein the doped concentration of the first doped region is lower than that of the second doped region, and the second doped region serves as a drain region;

a third and fourth doped region sequentially disposed on a second side of the semiconductor layer, which is opposite to the first side; wherein the doped concentration of the third doped region is lower than that of the fourth doped region that serves as a source region and the length of the third doped region is less than that of the first doped region;

an insulating layer disposed on the surface of the semiconductor layer, and the first, second, third and fourth regions;

a source and drain electrode penetrating the insulating layer contacting the source and drain regions respectively, wherein the drain electrode receives a drain voltage and the source electrode is electrically connected to an OLED unit; and a conductive layer serving as a gate layer disposed in the insulating layer, at approximately the top right portion of the semiconductor layer.

9. The control thin film transistor as claimed in claim 8, wherein the semiconductor layer is composed of polysilicon.

10. The control thin film transistor as claimed in claim 8, wherein the first, second, third and fourth doped regions are n-type doped.

11. The control thin film transistor as claimed in claim 8, wherein the first, second, third and fourth doped regions are p-type doped.

12. The control thin film transistor as claimed in claim 8, wherein the first, second, third and fourth doped regions are mainly composed of silicon.

* * * * *